(12) United States Patent
Morita et al.

(10) Patent No.: US 7,292,042 B2
(45) Date of Patent: Nov. 6, 2007

(54) GROUND FAULT DETECTOR FOR VEHICLE

(75) Inventors: Tsuyoshi Morita, Zama (JP); Shinsuke Nakazawa, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 0 days.

(21) Appl. No.: 11/483,458

(22) Filed: Jul. 10, 2006

(65) Prior Publication Data

US 2007/0008666 A1    Jan. 11, 2007

(30) Foreign Application Priority Data

Jul. 11, 2005    (JP) ............................. 2005-201586

(51) Int. Cl.
*G01R 31/14* (2006.01)
*H02H 3/00* (2006.01)

(52) U.S. Cl. ....................................... 324/509; 361/42
(58) Field of Classification Search ................ 324/509, 324/500, 512, 528, 531, 541, 544, 557, 772, 324/510; 361/42, 65, 86, 87, 88, 113
See application file for complete search history.

(56) References Cited

U.S. PATENT DOCUMENTS

| | | | | |
|---|---|---|---|---|
| 4,542,432 A | * | 9/1985 | Nichols et al. | ................ 361/44 |
| 4,589,048 A | * | 5/1986 | Takata | ........................ 361/42 |
| 5,363,047 A | * | 11/1994 | Dresti et al. | ................ 324/510 |
| 6,154,036 A | * | 11/2000 | Baldwin | ...................... 324/509 |
| 6,794,879 B2 | * | 9/2004 | Lawson et al. | ............. 324/509 |
| 6,906,525 B2 | | 6/2005 | Suzuki | |
| 6,984,988 B2 | * | 1/2006 | Yamamoto | ................... 324/509 |

FOREIGN PATENT DOCUMENTS

| | | |
|---|---|---|
| JP | 2003-250201 | 9/2003 |
| JP | 2004-053365 | 2/2004 |
| JP | 2004-053367 | 2/2004 |
| JP | 2005-057961 | 3/2005 |

* cited by examiner

*Primary Examiner*—Vincent Q. Nguyen
*Assistant Examiner*—Hoai-An D. Nguyen
(74) *Attorney, Agent, or Firm*—Young Basile Hanlon MacFarlane & Helmoldt, P.C.

(57) ABSTRACT

A ground fault detector and detection method for a vehicle that can determine the cause of the occurrence of a ground fault after detecting the presence of the ground fault. The output terminal of a high-voltage battery is connected to one side of a coupling capacitor. In operation, a pulse signal is applied to a measurement point on the other side of the coupling capacitor, and the voltage generated at that point is detected. Whether the high-voltage battery or the electrical equipment units are grounded is determined. To determine the cause of the ground fault, the oscillation frequency of the square-wave pulse signal is changed and applied to the measurement point. From the change in voltage amplitude detected, it is determined whether the cause of the ground fault is a resistive or a capacitive ground fault, according to the change in the impedance of the battery or the units.

20 Claims, 10 Drawing Sheets

FIG. 4
| FIG. 4A |
| FIG. 4B |
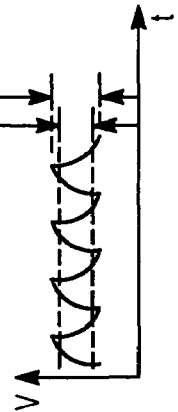
(A)
GROUND FAULT GENERATION (V: NORMAL AMPLITUDE > V1: GROUND FAULT DETECTION AMPLITUDE)
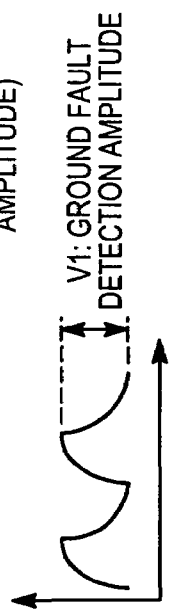
DIAGNOSIS AS THE PULSE FREQUENCY IS LOWERED
(B) RL RESISTIVE GROUND FAULT R
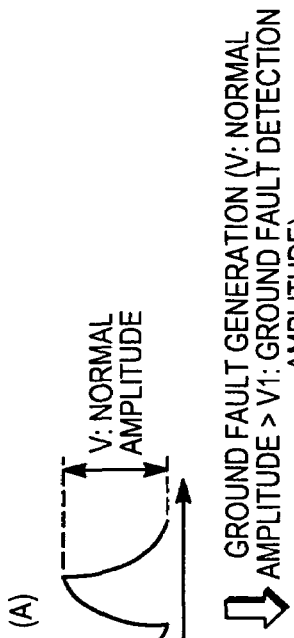
DIAGNOSIS AS THE PULSE FREQUENCY IS RAISED
(C) RL RESISTIVE GROUND FAULT R
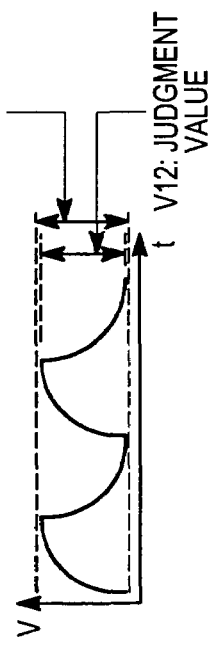
FIG. 4A

| | BATTERY | UNIT 3A | UNIT 3B | UNIT 3C |
|---|---|---|---|---|
| SW4A | OFF | ON | ON | ON |
| SW4D | OFF | OFF | OFF | OFF |
| SW4B | OFF | OFF | ON | OFF |
| SW4C | OFF | OFF | OFF | ON |

GROUND FAULT DETECTOR FOR VEHICLE

CROSS-REFERENCE TO RELATED APPLICATION

This application claims priority from Japanese Patent Application Serial No. 2005-201586, filed Jul. 11, 2005, the entire contents of which is incorporated herein by reference.

TECHNICAL FIELD

The present invention pertains to a ground fault detector for a vehicle that detects the occurrence of a ground fault in the high-voltage power source and various electrical equipment units to the chassis of electrically-powered automobiles, for example.

BACKGROUND

Usually, in electrically-powered automobiles, fuel-cell vehicles, hybrid electric motorbikes, and other electrically-powered vehicles, the high-voltage circuit connected to the high-voltage battery and the vehicle electric circuit grounded to the vehicle chassis are isolated. The ground fault detector described in Japanese Kokai Patent Application No. 2003-250201 is an example of a grounding fault detector that determines whether the high-voltage power source is grounded.

In this ground fault detector, one side of a coupling capacitor is connected to the plus terminal of a DC power source, and a square-wave pulse signal at a prescribed frequency is applied to the measurement point on the other side of the coupling capacitor. The occurrence of ground faults in the DC power source can be detected by the voltage generated at the measurement point.

Although the known ground fault detector can detect the occurrence of a ground fault, it cannot determine its cause. Ground faults may occur, for example, due to the direct contact of the high-voltage circuit that includes the power source harness to the vehicle chassis, or to the presence of water that has penetrated between the high-voltage circuit and the vehicle chassis. Since the cause of a ground fault is not identified, repair becomes difficult.

BRIEF SUMMARY OF THE INVENTION

Embodiments of the invention provide a ground fault detector and a ground fault detection method for a vehicle. A ground fault detector for determining a ground fault in a circuit connected to a power source can include, for example, a capacitor, one side of which is connected to an output of the power source, a pulse generator that applies a pulse signal to a measurement point on an opposite side of the capacitor, where the pulse signal generated at a oscillation frequency, a voltage detecting part that detects the voltage amplitude generated at the measurement point when the pulse signal is applied to the measurement point and a controller. The controller is operable to detect an occurrence of a ground fault in the circuit based on a change in the voltage amplitude as compared to an original voltage amplitude of the pulse signal, to change the oscillation frequency of the pulse signal, and to determine a cause of the occurrence of the ground fault by comparing the voltage amplitude detected when the pulse signal is generated at the oscillation frequency to a voltage amplitude resulting from generation of the pulse signal at a changed oscillation frequency.

Another ground fault detector for evaluating ground faults in an electrical system of a vehicle where the electrical system includes a power source as disclosed herein includes an output terminal of the power source connected to one side of a coupling capacitor, pulse generating means for applying a pulse signal at a prescribed oscillation frequency to a measurement point on an opposite side of the capacitor, voltage detection means for detecting a voltage amplitude generated at the measurement point when the pulse signal is applied, ground fault detection means for detecting an occurrence of a ground fault of the circuit based on the voltage amplitude detected by the voltage detection means and cause-of-ground-fault judgment means for changing an oscillation frequency of the pulse signal applied to the measurement point and for determining a cause of the ground fault based on a change in the voltage amplitude detected before and after change of the oscillation frequency Ground fault detection methods for an electric system for a vehicle are also taught herein. One ground fault detection method comprises, for example, applying a pulse signal to a measurement point at one end of a coupling capacitor, the other end of the coupling capacitor coupled to the power source, detecting a voltage amplitude generated at the measurement point, detecting a presence or an absence of a ground fault of the system based on comparing the voltage amplitude to an amplitude of the pulse signal, changing an oscillation frequency of the pulse signal when the presence of the ground fault is detected and comparing a change in the voltage amplitude before and after the changing of the oscillation frequency, the change indicating a cause of the ground fault.

BRIEF DESCRIPTION OF THE DRAWINGS

The description herein makes reference to the accompanying drawings wherein like reference numerals refer to like parts throughout the several views, and wherein:

FIGS. 4A and 4B illustrate in (A) a diagram illustrating the change in the pulse signal that occurs when a ground fault occurs; in (B) a diagram illustrating the change in the pulse signal that occurs when the oscillation frequency is reduced; and in (C) a diagram illustrating the change that occurs in the pulse signal when the oscillation frequency is increased;

DETAILED DESCRIPTION OF EMBODIMENTS OF THE INVENTION

Figure 1:
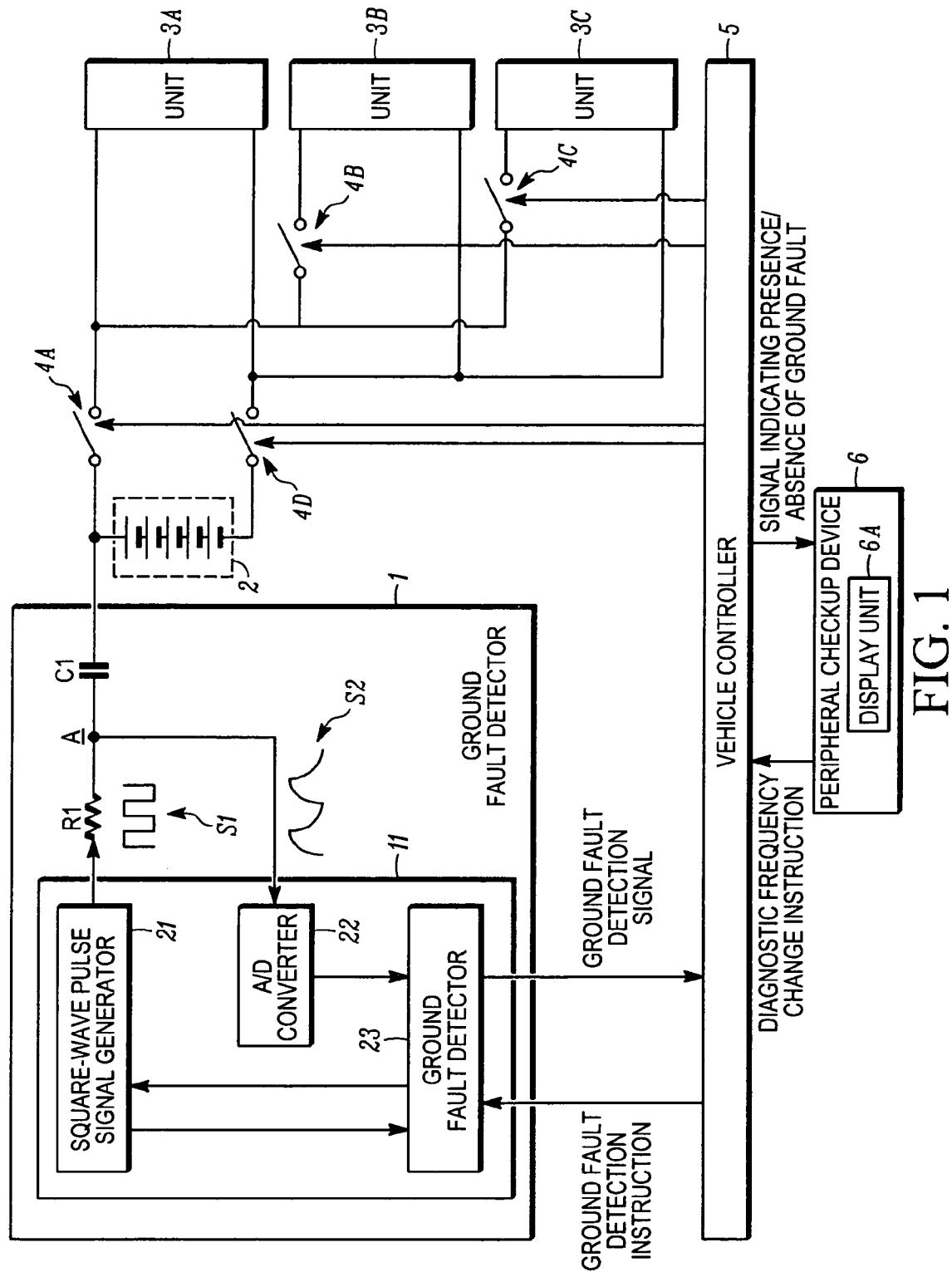
FIG. 1 is a block diagram illustrating an example of a vehicle electrical system to which embodiments of the present invention can be applied.

In the following, embodiments of the invention are explained in more detail with reference to application examples illustrated with figures. One embodiment of a ground fault detector 1 of the vehicle electrical system is shown in FIG. 1. In this vehicle electrical system, ground fault detector 1 determines the occurrence of a ground fault in the high-voltage electrical system circuit (hereinafter referred to as the "high-voltage electrical system") that includes high-voltage battery 2, plural electrical equipment units 3A, 3B, 3C (hereinafter referred to in general as "electrical equipment unit 3"), and the harness that connects high-voltage battery 2 and electrical equipment unit 3. Moreover, the cause of the occurrence of a ground fault is determined. Here, electrical equipment unit 3 can include motor inverters, air conditioners, etc., for example.

When the switch circuit is on, electrical equipment unit 3 performs switching control of the DC voltage from high-voltage battery 2, and electrical equipment unit 3 supplies AC voltage to the motor or the like. Upon the reception of a request for generation of driving force of the electric vehicle, electrical equipment unit 3 supplies power from high-voltage battery 2 to the motor or the like. Electrical equipment unit 3 is isolated by means of insulation resistance from the electric member as the electronic circuit with a voltage lower than that of the high-voltage electrical system of the electric vehicle (hereinafter referred to as the "low-voltage electrical system").

In order to supply power to electrical equipment unit 3, high-voltage battery 2 is connected to each electrical equipment unit 3. Switch circuit 4A is connected to the plus terminal of high-voltage battery 2, and switch circuit 4D is connected to the minus terminal of high-voltage battery 2. Also, high-voltage battery 2 is connected via switch circuit 4A to the positive terminal of electrical equipment unit 3A and via switch circuits 4A and 4B to the positive terminal of electrical equipment unit 3B. High-voltage battery 2 is connected via switch circuits 4A and 4C to the positive terminal of electrical equipment unit 3C. In addition, high-voltage battery 2 is connected via switch circuit 4D to the negative terminals of each of electrical equipment unit 3A, electrical equipment unit 3B and electrical equipment unit 3C. Switch circuits 4A, 4B, 4C and 4D are opened and closed under the control signal of vehicle controller 5.

During the diagnosis of the occurrence of a ground fault, vehicle controller 5 outputs a ground fault detection instruction to ground fault detector 1, and vehicle controller 5 controls the opening and closing of switch circuit 4A to switch circuit 4D. Then, if a ground fault-detection instruction is output, but the occurrence of a ground fault is not detected by ground fault detector 1, vehicle controller 5 outputs a ground fault signal indicating this state to peripheral checkup device 6. On the other hand, if a ground fault detection instruction is output, and ground fault detector 1 detects the occurrence of a ground fault, vehicle controller 5 outputs a ground fault signal reporting the occurrence of a ground fault to peripheral checkup device 6.

During diagnosis of the occurrence of a ground fault in the vehicle, peripheral checkup device 6 is connected to vehicle controller 5 in the vehicle by a technician. When the cause of the occurrence of a ground fault is determined, peripheral checkup device 6 outputs an instruction to change the diagnostic frequency to vehicle controller 5. Then, by means of the ground fault signal input corresponding to the instruction to change the diagnostic frequency, the cause of the occurrence of a ground fault is specified. Also, peripheral checkup device 6, which includes display unit 6A, presents a signal indicating the presence/absence of the occurrence of a ground fault, ground fault location, ground fault site information, type-of-ground-fault information that indicates the cause of the occurrence of a ground fault, etc., to the technician.

Ground fault detector 1 detects a ground fault between the high-voltage electrical system on the side of high-voltage battery 2, electrical equipment unit 3, etc., and the low-voltage electrical system. Consequently, ground fault detector 1 detects the insulation resistance of high-voltage battery 2. More specifically, ground fault detector 1 includes coupling capacitor C1 connected to the plus output terminal (+) of high-voltage battery 2, resistor R1 and controller 11. Also, in this example, coupling capacitor C1 is connected to the plus output terminal (+) of high-voltage battery 2. However, it may also be connected to minus output terminal (−) of high-voltage battery 2.

Controller 11, between resistor R1 and coupling capacitor C1, operates as both a pulse generating means that supplies a square-wave pulse voltage signal S1 to one side (measurement point A) of coupling capacitor C1 and as a voltage detection means that measures the voltage S2 generated at measurement point A. In addition to detecting the voltage S2 generated at measurement point A, the controller 11 evaluates ground faults in the high-voltage electrical system. Controller 11 includes square-wave pulse signal generator 21 that outputs a pulse signal, A/D converter 22 that performs A/D conversion of the voltage signal S2 generated at measurement point A between resistor R1 and capacitor C1, and ground fault detector 23. Ground fault detector 23 comprises a CPU, etc., and operates as the control center as described in more detail hereinafter.

When occurrence of a ground fault, the cause of the occurrence of a ground fault, and the site of the occurrence of a ground fault in the high-voltage electrical system are evaluated, ground fault detector 23 outputs a pulse signal S1 from square-wave pulse signal generator 21, and it reads the change in the voltage amplitude input from A/D converter 22 with respect to the pulse signal. The ground fault detection signal detected by ground fault detector 23 is transmitted to vehicle controller 5. Also, ground fault detector 23 includes a memory (not shown in the figure). The memory can be integrated with the CPU where the ground fault detector 23 is in the form of a microcontroller or the like. The memory stores the occurrence of a ground fault judgment value that judges the presence or absence of the occurrence of a ground fault by comparing the voltage amplitude measured by A/D converter 22, the cause-of-ground-fault judgment value for high frequency for specifying the cause of the fault by increasing the oscillation frequency of the pulse signal, and the ground fault judgment value for low frequency for specifying the cause of the ground fault by lowering the oscillation frequency of the pulse signal S1.

Here, when a ground fault occurs in the high-voltage electrical system, even when the pulse signal S1 is generated by square-wave pulse signal generator 21, the voltage amplitude input by A/D converter 22 becomes smaller than the voltage amplitude of the pulse signal when no ground fault occurs. Consequently, ground fault detector 23 compares the voltage amplitude input by A/D converter 22 and the prescribed judgment value for the occurrence of a ground fault stored in the memory, and it outputs a ground fault detection signal indicating the presence or absence of the occurrence of a ground fault in the high-voltage electrical system to vehicle controller 5.

Also, when the occurrence of a ground fault is detected the vehicle electrical system reduces the oscillation frequency of the pulse signal generated by square-wave pulse signal generator 21 and compares the voltage amplitude input by A/D converter 22 and the cause-of-ground-fault judgment value for low frequency, and, at the same time, the oscillation frequency of the pulse signal generated by square-wave pulse signal generator 21 is increased, the voltage amplitude input by A/D converter 22 is compared with the cause-of-a-ground-fault judgment value for high frequency, and the cause of the occurrence of a ground fault is specified.

The oscillation frequency of the pulse signal S1 generated by oscillation of square-wave pulse signal generator 21 should be lower than the switching frequency generated by electrical equipment unit 3. In addition, the frequency should be lower than the AC circuit other than electrical equipment unit 3, and the frequency should be low and in a range that is not used by the vehicle electrical system, such as in the range of about 5 to about 20 Hz. Since an electrical connection is formed between ground fault detector 1 and electrical equipment unit 3, switching noise from the inverter as electrical equipment unit 3 and other high-frequency noise flow from electrical equipment unit 3 to ground fault detector 1. Also, when the motor connected to electrical equipment unit 3 is a three-phase AC motor, high-frequency noise on the order of 100 kHz to hundreds of kHz flows into ground fault detector 1 so that an oscillation frequency lower than this frequency band is used.

In the following, an explanation will be given regarding the judgment of the cause of the occurrence of a ground fault using the vehicle electrical system as described.

Figure 2:
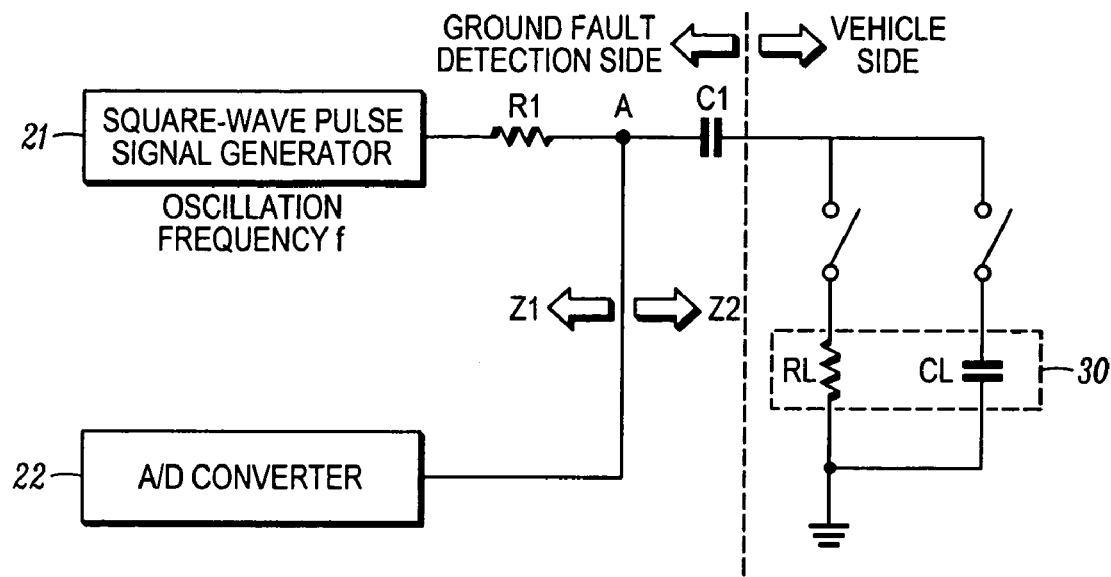
FIG. 2 is a block diagram illustrating an example of a circuit used to determine the cause of grounding of the vehicle electrical system.

In the vehicle electrical system, as indicated by ground fault generator 30 shown in FIG. 2, the location of the occurrence of a ground fault in the high-voltage electrical system, high-voltage battery 2 or electrical equipment unit 3 is connected to the vehicle chassis either directly or via an electrically conductive foreign object. In one case, a resistive ground fault occurs for high-voltage battery 2 and electrical equipment unit 3 via resistor RL. In the other case, as water or the like penetrates between high-voltage battery 2 and electrical equipment unit 3 and the vehicle chassis, a capacitive ground fault occurs for high-voltage battery 2 and electrical equipment unit 3 via capacitor CL.

Figure 3:
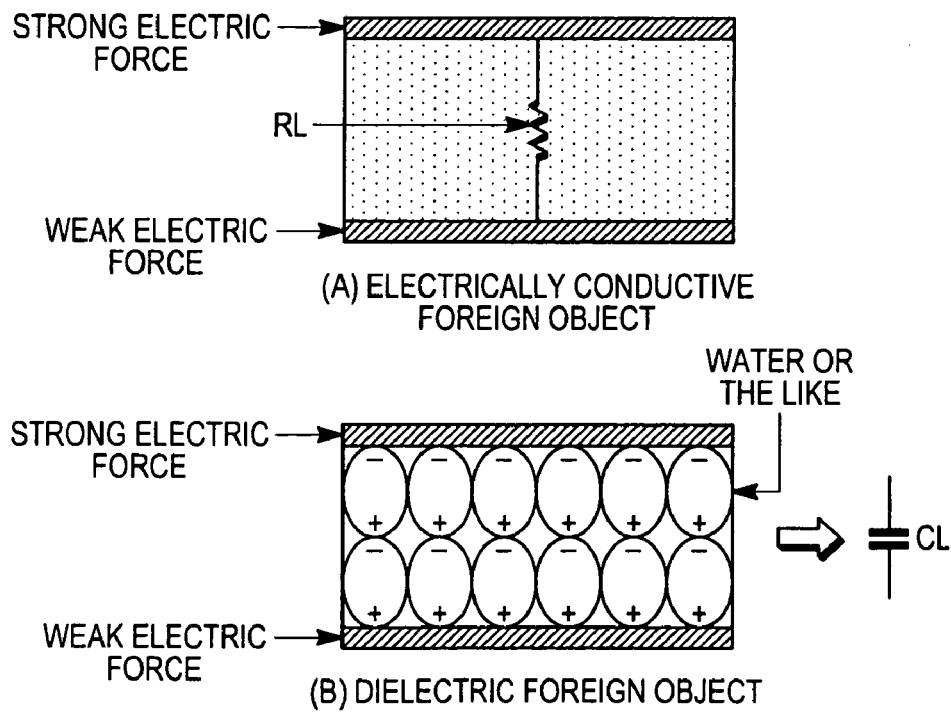
FIG. 3 illustrates the difference in the cause of grounding for different types of foreign objects that come between the high-voltage electrical system and the low-voltage electrical system wherein (A) shows the case when the foreign object is an electrically conductive material, and (B) shows the case when the foreign object is a dielectric material.

As shown in (A) of FIG. 3, the resistive ground fault is due to the presence of an electrically conductive foreign object between the high-voltage electrical system and the low-voltage electrical system on the side of ground fault detector 1, and the resistive ground fault is equivalent to the presence of resistor RL. That is, a resistive ground fault is the occurrence of a ground fault via resistor RL. Also, as shown in (B) of FIG. 3, the capacitive ground fault is a ground fault that is equivalent to presence of capacitor CL and occurs via capacitor CL as a dielectric foreign object having a low electroconductivity trapped between the high-voltage electrical system and the low-voltage electrical system on the side of ground fault detector 1.

Impedance Z1 on the side of ground fault detector 1 as the side of controller 11 from measurement point A when a ground fault does not occur becomes resistor R1. On the other hand, impedance Z2 on the side of the vehicle from measurement point A when no ground fault occurs becomes ∞ (infinite). Consequently, when no ground fault occurs, the ratio of impedance Z1 on the side of ground fault detector 1 to impedance Z2 on the side of the vehicle is as shown in Equation 1:

$$Z1:Z2=R1:\infty \qquad \text{(Equation 1)}.$$

When a resistive ground fault occurs, grounding resistor RL is added, and vehicle-side impedance Z2 becomes RL+½πf C1. The ratio of impedance Z1 on the side of ground fault detector 1 to vehicle-side impedance Z2 becomes the following:

$$Z1:Z2=R1:RL+\tfrac{1}{2}\pi fC1 \qquad \text{(Equation 2)}$$

When a resistive ground fault occurs what influences the oscillation frequency of the pulse signal is only the impedance of (½f C1) based on coupling capacitor C1.

When a capacitive ground fault occurs, ground fault capacitance CL is added, and vehicle-side impedance Z2 becomes ½πf CL+½πf C1. The ratio of impedance Z1 on the side of ground fault detector 1 to vehicle-side impedance Z2 is as shown:

$$Z1:Z2=R1:\tfrac{1}{2}\pi fCL+\tfrac{1}{2}\pi fC1 \qquad \text{(Equation 3)}.$$

That is, when a capacitive ground fault occurs the factors that effect the oscillation frequency of the pulse signal are based on impedance (½πf CL) based on ground fault capacitance CL in addition to impedance (½f C1) based on coupling capacitor C1.

In this way, vehicle-side impedance Z2 varies due to the presence or absence of the occurrence of a ground fault and the cause of the occurrence of the ground fault. Consequently, as shown in (A) of FIG. 4, if there is no ground fault the pulse signal at measurement point A detected by A/D converter 22 has normal amplitude V. On the other hand, when a resistive ground fault or capacitive ground fault occurs, for the pulse signal at measurement point A detected by A/D converter 22 the vehicle-side impedance Z2 when no ground fault occurs becomes greater than vehicle-side impedance Z2 when a ground fault occurs, and the pulse signal at measurement point A has ground fault detection amplitude V1, which is less than normal amplitude V.

When a ground fault occurs, for a resistive ground fault and a capacitive ground fault there is a difference in vehicle-side impedance Z2 as shown in Equations 2 and 3 above. Consequently, as shown in FIG. 5, the state of change in the impedance corresponding to the oscillation frequency given to measurement point A becomes different.

In the case of a capacitive ground fault, as oscillation frequency f2 (e.g., 5 Hz), which is lower than basic oscillation frequency f1 (e.g., 10 Hz), is applied to measurement point A, in Equation 3 the term ½πfCL+½πfC1 has the effect that vehicle-side impedance Z2 on the vehicle side decreases from Z11 to Z13. In the case of a resistive ground fault, as oscillation frequency f2, which is lower than basic oscillation frequency f1, is applied to measurement point A, in Equation 2 the term ½πfC1 has the effect that vehicle-side impedance Z2 decreases from Z11 to Z12. In this way, as the oscillation frequency decreases from f1 to f2 the variation of vehicle-side impedance Z2 when a resistive ground fault occurs (Z11-Z12) becomes greater than the variation of vehicle-side impedance Z2 when a capacitive ground fault occurs (Z11-Z13).

Figure 4B:
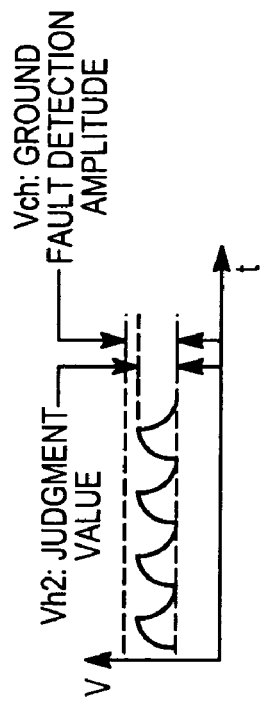
Figure 4B:
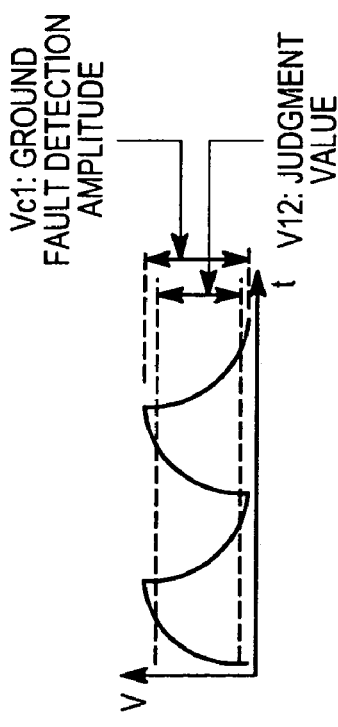

Consequently, as shown in (B) of FIG. 4, when vehicle-side impedance Z2 becomes Z12 as a resistive ground fault occurs, the pulse signal appearing at measurement point A has ground fault detection amplitude Vr1, which is lower than low-frequency cause-of-ground-fault judgment value V12. On the other hand, when a capacitive ground fault occurs, and vehicle-side impedance Z2 becomes Z13, the pulse signal appearing at measurement point A has ground fault detection amplitude Vc1, which is higher than low-frequency cause-of-ground-fault judgment value V12. That is, one has the following relationship: ground fault detection amplitude Vc1 when the oscillation frequency is decreased to f2 is greater than low-frequency cause-of-ground-fault judgment value V12, which is greater than ground fault detection amplitude Vr1 when the oscillation frequency is decreased to f2. As a result, in the vehicle electrical system when the oscillation frequency decreases from f1 to f2 it can be judged as a resistive ground fault when the amplitude of the pulse signal appearing at measurement point A is smaller than low-frequency cause-of-ground-fault judgment value V12, and it is judged as a capacitive ground fault when the amplitude is larger than low-frequency cause-of-ground-fault judgment value V12.

Figure 5:
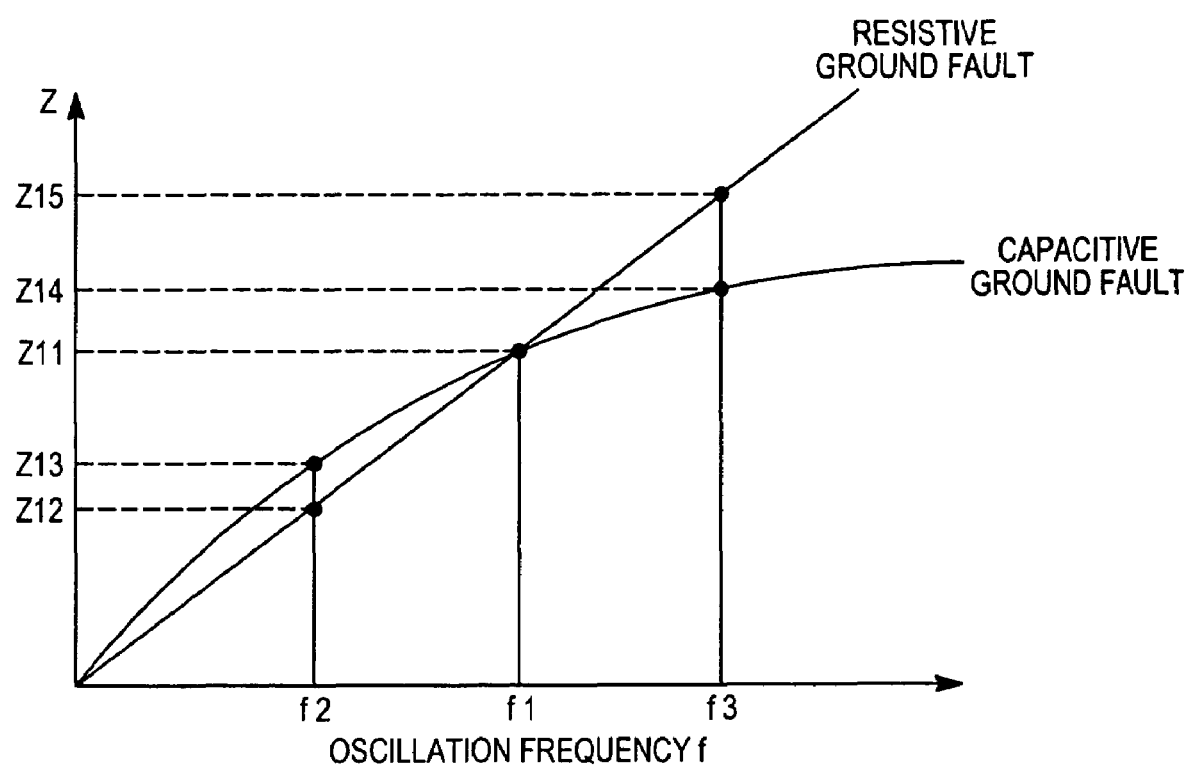
FIG. 5 is a graph illustrating vehicle-side oscillation frequency versus impedance.

On the other hand, as shown in FIG. 5, in the case of a capacitive ground fault when oscillation frequency f3 (e.g., 20 Hz), which is higher than basic oscillation frequency f1, is applied to measurement point A, in Equation 3 the term $\frac{1}{2\pi fCL} + \frac{1}{2\pi fC1}$ has the effect that vehicle-side impedance Z2 rises from Z11 to Z14. In the case of a resistive ground fault, as oscillation frequency f3 is applied to measurement point A, term $\frac{1}{2\pi fC1}$ in Equation 2 has the effect that vehicle-side impedance Z2 rises from Z11 to Z15. In this way, as the oscillation frequency is increased from f1 to f3, the change in vehicle-side impedance Z2 (Z15-Z11) in the case of a resistive ground fault becomes larger than the change in vehicle-side impedance Z2 (Z14-Z11) in the case of a capacitive ground fault.

Consequently, as shown in (C) of FIG. 4, when vehicle-side impedance Z2 becomes Z15, and a resistive ground fault occurs, the pulse signal appearing at measurement point A has ground fault detection amplitude Vrh, which is higher than high-frequency cause-of-ground-fault judgment value Vh2. On the other hand, when vehicle-side impedance Z2 becomes Z14, and a capacitive ground fault occurs, the pulse signal appearing at measurement point A has ground fault detection amplitude Vch, which is smaller than high-frequency cause-of-ground-fault judgment value Vh2. That is, one has the following relationship: ground fault detection amplitude Vrh when the oscillation frequency is increased to f3 is greater than high-frequency cause-of-ground-fault judgment value Vh2, which is greater than ground fault detection amplitude Vch when oscillation frequency is increased to f3. As a result, for the vehicle electrical system when the oscillation frequency is increased from f1 to f3 it is judged to be a resistive ground fault when the amplitude of the pulse signal appearing at measurement point A is larger than high-frequency cause-of-ground-fault judgment value Vh2, and it is judged to be a capacitive ground fault when the amplitude is smaller than high-frequency cause-of-ground-fault judgment value Vh2.

Figures 6, 7:
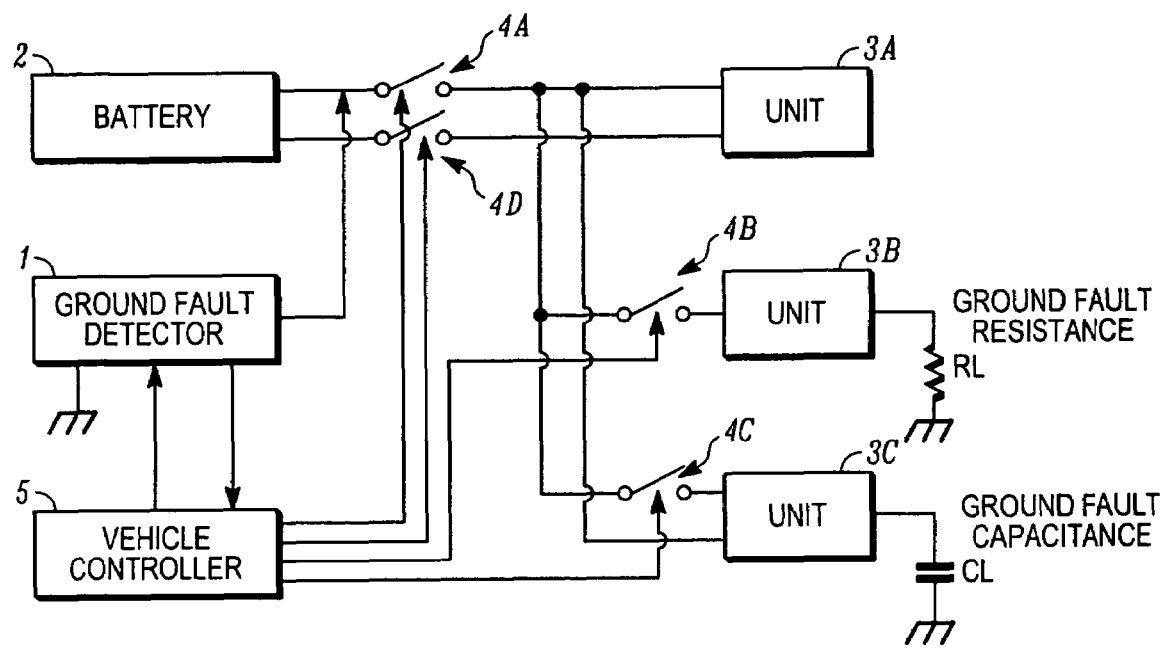
FIG. 6 is a block diagram used to illustrate a method used to determine the site of the occurrence of a ground fault in the vehicle.
FIG. 7 is a diagram illustrating the switch states when the site of the occurrence of a ground fault is diagnosed for both the high-voltage battery of the high-voltage electrical system and the electrical equipment units.

In the following, an explanation will be given regarding the judgment of the site of the occurrence of a ground fault due to the vehicle electrical system. As shown in FIG. 6, in the vehicle electrical system examples of sites of the occurrence of a ground fault include high-voltage battery 2, electrical equipment unit 3 of various types, and the harness connecting high-voltage battery 2 and electrical equipment unit 3. On the other hand, as shown in FIG. 6 the vehicle electrical system includes switch circuits 4A, 4B, 4C and 4D that are turned on and off by vehicle controller 5 set in the harness that connects high-voltage battery 2 and electrical equipment unit 3.

For the vehicle electrical system according to the example shown in FIG. 6, it is possible to distinguish and detect the following states: 1) the state of a resistive ground fault that occurs between electrical equipment unit 3B and the vehicle chassis, 2) the state of a capacitive ground fault that occurs between electrical equipment unit 3C and the vehicle chassis, and 3) the state in which no ground fault occurs in electrical equipment unit 3A. Consequently, as shown in FIG. 7 it is possible to specify the occurrence of a ground fault at any location in the vehicle electrical system by turning on/off switch circuit 4A, switch circuit 4B, switch circuit 4C and switch circuit 4D.

When the occurrence of a ground fault between high-voltage battery 2 and switch circuits 4A, 4D (hereinafter referred to as ground fault of high-voltage battery 2), is to be determined, each of switch circuits 4A through 4D are off, and only ground fault detector 1 and high-voltage battery 2 are in contact with each other. As a result, if the occurrence of a ground fault is detected by ground fault detector 1, it is possible to specify that high-voltage battery 2 is the site of the occurrence of a ground fault.

Also, when the occurrence of a ground fault in electrical equipment unit 3A is to be detected after a ground fault has not occurred in high-voltage battery 2, only switch circuit 4A is turned on, and the ground fault can be detected by ground fault detector 1. When the occurrence of a ground fault in electrical equipment unit 3B is to be detected, switch circuit 4A and switch circuit 4B are turned on, and the ground fault can be detected by ground fault detector 1. When the occurrence of a ground fault in electrical equipment unit 3C is to be detected, switch circuit 4A and switch circuit 4C are turned on, and the ground fault can be detected by ground fault detector 1.

In this way, by controlling the on/off state of switch circuits 4A-4D from vehicle controller 5 in the combination shown in FIG. 7, it is possible to detect the site of the occurrence of a ground fault in either high-voltage battery 2 or any of electrical equipment units 3A-3D.

In the following, the series of processes used to determine the occurrence of a ground fault, the cause of the occurrence of a ground fault and the site of the occurrence of a ground fault in the vehicle electrical system are explained with reference to FIGS. 8 and 9.

In this vehicle electrical system, the technician who performs the ground fault diagnosis first connects peripheral checkup device 6 to vehicle controller 5. As a result, in step ST1 an instruction to diagnose a ground fault is sent from peripheral checkup device 6 to vehicle controller 5. Then, in step ST2 in order to start the ground fault diagnosis by ground fault detector 1 vehicle controller 5 sends a ground fault detection instruction to determine the normal occurrence of a ground fault to ground fault detector 1. Also in this step ST2, in order to diagnose whether a ground fault occurs in the overall high-voltage electrical system vehicle controller 5 turns on all of switch circuits 4A-4D.

In the next step, step ST3, ground fault detector 1 receives a ground fault detection instruction from vehicle controller 5. In addition, ground fault detector 1 outputs a square-wave pulse signal at a prescribed oscillation frequency f1 (e.g., 10 Hz) from square-wave pulse signal generator 21 by means of ground fault detector 23 to measurement point A, and A/D converter 22 inputs the pulse signal. Then, ground fault detector 23 determines whether amplitude V1 of the voltage of the pulse signal input by A/D converter 22 is lower than prescribed ground fault detection amplitude V. If amplitude V1 of the voltage of the pulse signal is lower than the prescribed ground fault detection amplitude V, a ground fault detection signal indicating the occurrence of a ground fault is sent to vehicle controller 5, and the process then goes to step ST5. Otherwise, the ground fault detection signal indicating no ground fault is sent to vehicle controller 5, and the process goes to step ST4.

In step ST4, vehicle controller 5 outputs the ground fault presence/absence signal indicating no ground fault at any location of the high-voltage electrical system to peripheral checkup device 6. Peripheral checkup device 6 displays "No Ground Fault" on display unit 6A, and the process comes to an end.

On the other hand, in step ST5 vehicle controller 5 starts the process for specifying the site of the occurrence of a ground fault. In step ST6 in order to diagnose whether a ground fault occurs in high-voltage battery 2, switch circuits 4A-4D are all turned off.

Then, in step ST7 ground fault detector 1 receives a ground fault detection instruction from vehicle controller 5, outputs a square-wave pulse signal at prescribed oscillation frequency f1 to measurement point A and receives input of a pulse signal. Ground fault detector 23 then determines whether amplitude V1 of the voltage of the input pulse signal is lower than prescribed ground fault detection amplitude V. If amplitude V1 of the voltage of the input pulse signal is lower than prescribed ground fault detection amplitude V it is determined that high-voltage battery 2 is grounded. The process then goes to step ST8. Otherwise, processing advances to step ST10.

Figure 9:
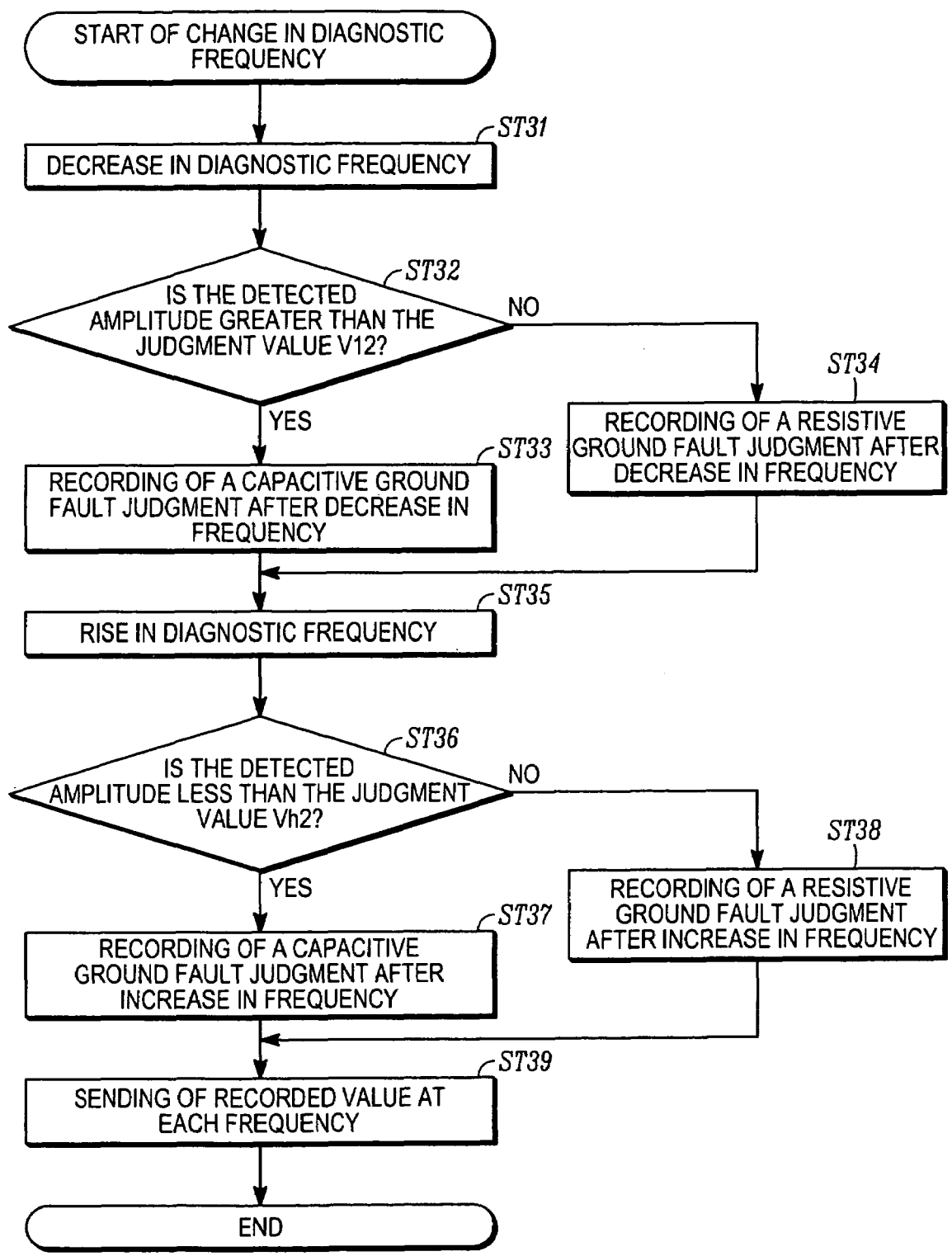
FIG. 9 is a flow chart illustrating an example of a process of diagnosing the cause of the ground fault by changing the oscillation frequency.

If it is determined that high-voltage battery 2 is grounded in response to step ST7, in step ST8 vehicle controller 5 supplies a ground fault signal indicating the occurrence of a ground fault in high-voltage battery 2 to peripheral checkup device 6, and peripheral checkup device 6 performs the process of determining the cause of the occurrence of the ground fault shown in FIG. 9.

In the process of determining the cause of the occurrence of a ground fault, in step ST31 shown in FIG. 9 an instruction to change the diagnostic frequency from oscillation frequency f1 down to f2 is sent from peripheral checkup device 6 to vehicle controller 5, and this instruction to change the diagnostic frequency is then sent from vehicle controller 5 to ground fault detector 23.

Next, in step ST32 when a square-wave pulse signal at oscillation frequency f2, which is lower than oscillation frequency f1, is sent from square-wave pulse signal generator 21 to measurement point A, as shown in (B) of FIG. 4, ground fault detector 23 determines whether the amplitude of the pulse signal input by A/D converter 22 is higher than low-frequency cause-of-ground-fault judgment value V12. If it is determined that the amplitude of the pulse signal is greater than low-frequency cause-of-ground-fault judgment value V12, in step ST33 the value for a greater capacitive ground fault in high-voltage battery 2 is stored. Otherwise, the value for a resistive ground fault in high-voltage battery 2 is stored in step ST34. Either way, the process advances to step ST35.

In step ST35 peripheral checkup device 6 sends an instruction to change the diagnostic frequency by increasing the oscillation frequency f3 to vehicle controller 5. This instruction to change the diagnostic frequency is sent from vehicle controller 5 to ground fault detector 23.

Next, in step ST36 when the square-wave pulse signal at oscillation frequency f3, which is higher than oscillation frequency f1, is sent from square-wave pulse signal generator 21 to measurement point A, as shown in (C) of FIG. 4, ground fault detector 23 determines whether the amplitude of the pulse signal input by A/D converter 22 is smaller than high-frequency cause-of-ground-fault judgment value Vh2. If it is determined that the pulse signal amplitude is smaller than high-frequency cause-of-ground-fault judgment value Vh2, then in step ST37 the value for a capacitive ground fault for high-voltage battery 2 is stored. Otherwise, in step ST38 the value for a resistive ground fault for high-voltage battery 2 is stored. In either case, the process advances to step ST39.

In step ST39 vehicle controller 5 sends to peripheral checkup device 6 several pieces of information, namely, the amplitude of the pulse signal at low oscillation frequency f2 acquired in steps ST32-34 and the amplitude of the pulse signal and the value for a resistive ground fault or a capacitive ground fault, as well as the amplitude of the pulse signal at high oscillation frequency f3 acquired in steps ST36-38, and the value for a resistive ground fault or a capacitive ground fault. The process then returns to step ST9 shown in FIG. 8.

In step ST9, on the basis of the ground fault signal sent in step ST8 peripheral checkup device 6 displays high-voltage battery 2 as the site of the occurrence of a ground fault. From the amplitude of the pulse signal with respect to oscillation frequencies f2, f3 sent in step ST39, and the value for a resistive ground fault or a capacitive ground fault, the type of ground fault, i.e., a resistive ground fault or a capacitive ground fault, the amplitude of the pulse signal when the type of ground fault is determined. Also, the values of oscillation frequencies f2, f3 are displayed. The process then comes to an end.

If it is determined in step ST7 that high-voltage battery 2 is not grounded then in step ST 10 only switch circuit 4A is turned on, and the square-wave pulse signal at prescribed oscillation frequency f1 is output to measurement point A. From the amplitude of the pulse signal input with A/D converter 22 it is determined in step ST11 whether a ground fault occurs in electrical equipment unit 3A.

When it is determined that electrical equipment unit 3A contains a ground fault, in step ST12 vehicle controller 5 sends a ground fault signal indicating the occurrence of the ground fault in electrical equipment unit 3A to peripheral checkup device 6, and peripheral checkup device 6 executes the process of determining the cause of the occurrence of a ground fault as shown in FIG. 9. In this process of determining the cause of the occurrence of a ground fault, electrical equipment unit 3A is the object. Otherwise, the same process is performed in step ST8 as in steps ST31-ST39, so that it is determined whether a resistive ground fault or a capacitive ground fault has occurred from the amplitude of the pulse signal input with A/D converter 22 when the square-wave pulse signal at oscillation frequency f2 is sent to measurement point A. In addition, it is determined whether a resistive ground fault or a capacitive ground fault occurred from the amplitude of the pulse signal input with A/D converter 22 when square-wave pulse signal at oscillation frequency f3 is applied to measurement point A, and the recorded value indicating the oscillation frequencies and amplitudes of the pulse signals and the value indicating a resistive ground fault or a capacitive ground fault are sent to peripheral checkup device 6.

Then, in step ST13, as in step ST9, on the basis of the ground fault signal sent to step ST12 as the site of the occurrence of a ground fault, electrical equipment unit 3A is displayed. From the amplitudes of the pulse signals at oscillation frequencies f2, f3 and the value for a resistive ground fault or a capacitive ground fault sent in step ST39, the type of ground fault, i.e., a resistive ground fault or a capacitive ground fault, the amplitude of the pulse signal when the type of ground fault is determined, and the values of oscillation frequencies f2, f3 are displayed. The process then comes to an end.

If it is determined in step ST11 that a ground fault has not occurred in electrical equipment unit 3A, then in step ST14 switch circuit 4B is turned on in addition to switch circuit 4A. The square-wave pulse signal at prescribed oscillation frequency f1 is output to measurement point A. In step ST 15 it is determined whether a ground fault has occurred in electrical equipment unit 3B from the amplitude of the pulse signal input with A/D converter 22.

If it is determined that electrical equipment unit 3B is grounded, in step ST16 vehicle controller 5 supplies a ground fault signal indicating the occurrence of a ground fault in electrical equipment unit 3B to peripheral checkup device 6. Peripheral checkup device 6 then executes the process of determining the cause of the occurrence of a ground fault as shown in FIG. 9. In this cause-of-ground-fault judgment process, besides using electrical equipment unit 3B as the object, by means of the process of steps ST31-ST39 as in step ST8 it is determined whether a resistive ground fault or a capacitive ground fault has occurred from the amplitude of the pulse signal input with A/D converter 22 when the square-wave pulse signal at oscillation frequency f2 is applied to measurement point A. In addition, it is determined whether a resistive ground fault or a capacitive ground fault has occurred from the amplitude of the pulse signal input with A/D converter 22 when square-wave pulse signal at oscillation frequency f3 is applied to measurement point A. The recorded value indicating the oscillation frequencies, the amplitude of the pulse signal, and the value indicating whether a resistive ground fault or a capacitive ground fault has occurred are sent to peripheral checkup device 6.

Then in step ST17, as in step ST9, on the basis of the ground fault signal sent in step ST16, electrical equipment unit 3B as the site of the occurrence of a ground fault is displayed. From the amplitudes of the pulse signals at oscillation frequencies f2, f3 and the value for whether a resistive ground fault or a capacitive ground fault has occurred sent in step ST39, the type of ground fault, i.e., a resistive ground fault or a capacitive ground fault, and the amplitude of the pulse signal when the type of ground fault is determined, and the values of oscillation frequencies f2, f3 are displayed. Then, the process comes to an end.

If the judgment in step ST15 is that a ground fault has not occurred in electrical equipment unit 3B, in step ST18 switch circuit 4B is turned off, and switch circuit 4C is turned on such that both switch circuits 4A and 4C are on. The square-wave pulse signal at prescribed oscillation frequency f1 is output to measurement point A. In step ST19, from the amplitude of the pulse signal input with A/D converter 22 it is determined whether a ground fault has occurred in electrical equipment unit 3C.

When it is determined that electrical equipment unit 3C is grounded, in step ST20 vehicle controller 5 sends a ground fault signal indicating the occurrence of a ground fault in electrical equipment unit 3C to peripheral checkup device 6. Peripheral checkup device 6 then executes the process of determining the cause of the occurrence of a ground fault as shown in FIG. 9. This process of determining the cause of the occurrence of a ground fault is performed in the same way as in step ST8 except that electrical equipment unit 3C is the object. That is, by performing the process of steps ST31-ST39 it is determined whether a resistive ground fault or a capacitive ground fault has occurred from the amplitude of the pulse signal input with A/D converter 22 when the square-wave pulse signal at oscillation frequency f2 is applied to measurement point A. In addition, it is determined whether a resistive ground fault or a capacitive ground fault has occurred from the amplitude of the pulse signal input with A/D converter 22 when square-wave pulse signal at oscillation frequency $f_3$ is applied to measurement point A. The recorded value indicating the oscillation frequencies, the amplitude of the pulse signal, and the value indicating whether ground a resistive ground fault or a capacitive ground fault has occurred are sent to peripheral checkup device 6.

In step ST21, as in step ST9, on the basis of the ground fault signal sent in step ST16 electrical equipment unit 3C is identified as the site of the occurrence of a ground fault on the display unit. From the amplitudes of the pulse signals at oscillation frequencies f2, f3, and the value indicating whether a resistive ground fault or a capacitive ground fault has occurred sent in step ST39, the type of ground fault, i.e., a resistive ground fault or a capacitive ground fault, the amplitude of the pulse signal when the type of ground fault is determined and the values of oscillation frequencies f2, f3 are displayed. Then, the process comes to an end.

In contrast, if it is determined in step ST 19 that a ground fault has not occurred in electrical equipment unit 3C, in step ST22 peripheral checkup device 6 is notified by detecting the occurrence of a ground fault in step ST3 by means of a ground fault in some location other than high-voltage battery 2 or electrical equipment units 3A-3C. In this case, it is displayed that the site of the occurrence of a ground fault is outside of the units being checked, and peripheral checkup device 6 displays in display unit 6a the amplitudes of the pulse signals obtained by high-voltage battery 2 and electrical equipment units 3A~3C, oscillation frequencies, f1, f2, f3, etc. Then, the process comes to an end.

As explained in detail above, for the vehicle electrical system the oscillation frequency of the pulse signal generated from square-wave pulse signal generator 21 is changed and is applied to measurement point A. And, from the change in the voltage amplitude detected by A/D converter 22 it is possible to determine the cause of the occurrence of a ground fault corresponding to the change in the impedance of the high-voltage electrical system. Consequently, it is possible to determine whether the ground fault is a resistive ground fault or a capacitive ground fault by means of the fact that the value of vehicle-side impedance Z2 from measurement point A when a resistive ground fault occurs and when a capacitive ground fault occurs will be different. Consequently, after a ground fault has occurred it is possible to perform maintenance tasks after the cause of the occurrence of a ground fault.

In addition, the vehicle electrical system contains switch circuits 4A-4D that switch the connections between ground fault detector 1 and high-voltage battery 2, and electrical equipment units 3A-3C. By means of switching the on/off operation shown in FIG. 7, it is possible to specify the site of the occurrence of a ground fault. Consequently, after the occurrence of a ground fault it is possible to specify the cause of the occurrence of a ground fault and the site of the occurrence of a ground fault. On the basis of this knowledge, it is possible to perform maintenance tasks.

The described embodiments are merely examples of the present invention and is not limiting thereby. As long as the technical idea of the present invention is observed, various changes in design, etc., from these embodiments can be adopted.

Figure 8A:
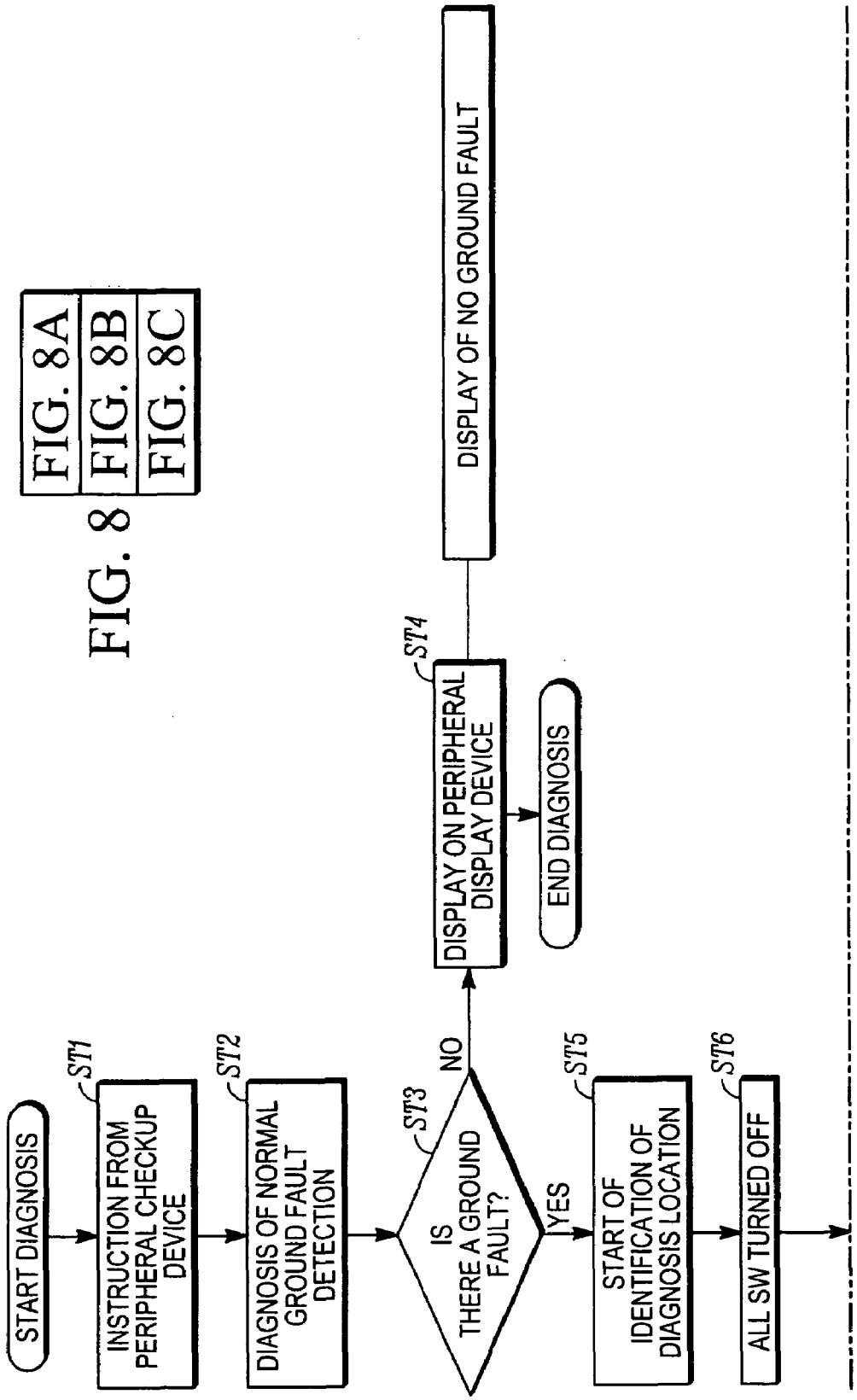
FIGS. 8A-8C contain a flow chart illustrating an example of a process for determining the cause of the occurrence of a ground fault and the site of the occurrence of a ground fault in a vehicle electrical system.
Figure 8B:
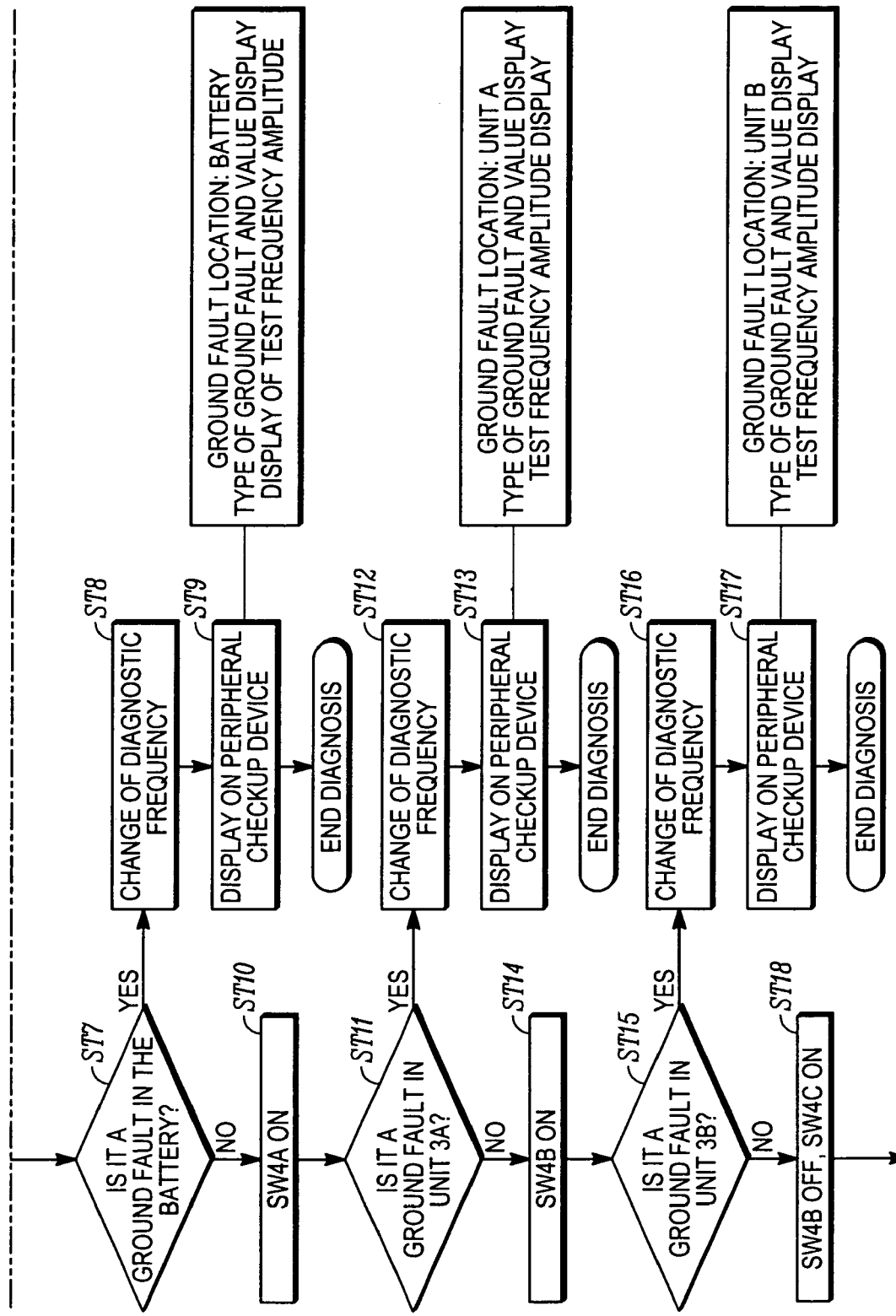
Figure 8C:
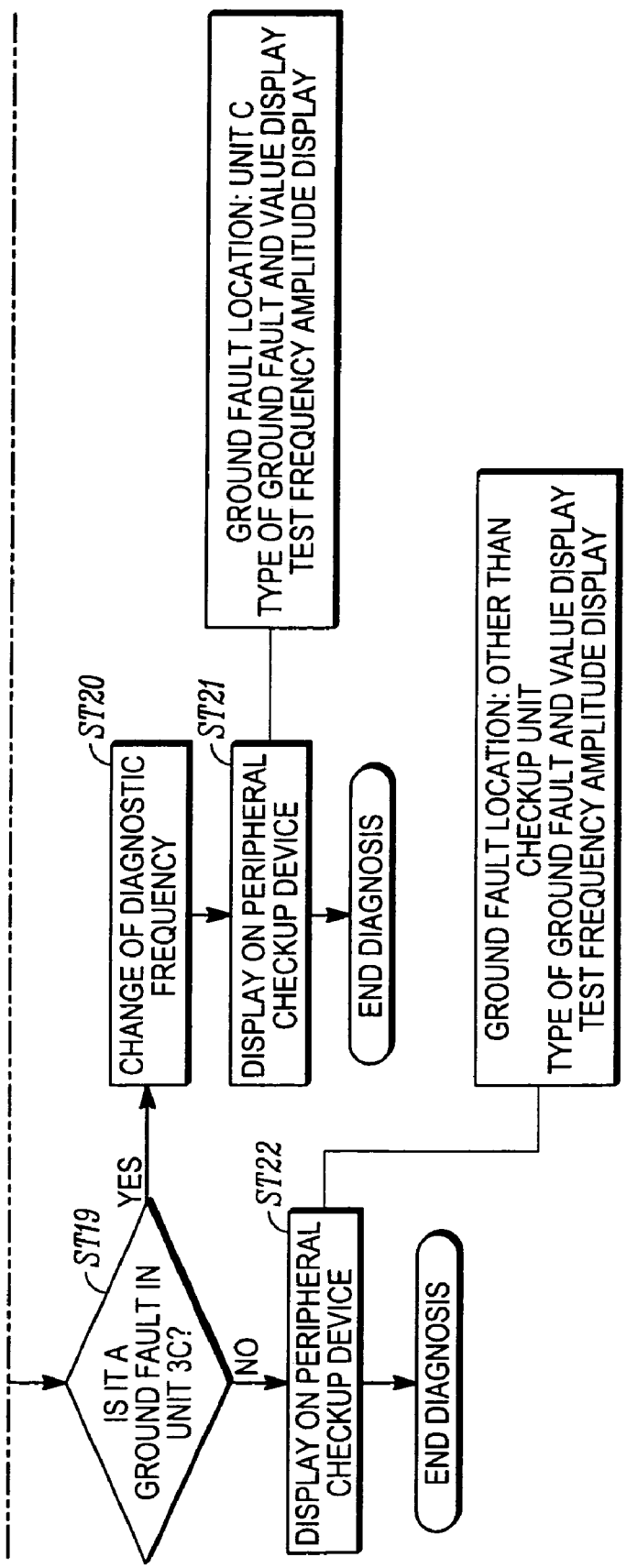

For example, in FIG. 8 an example is included in which peripheral checkup device 6 is connected to vehicle controller 5 to determine the occurrence of a ground fault, the cause of the occurrence of a ground fault and the site of the occurrence of a ground fault. One may also adopt a scheme in which peripheral checkup device 6 is always connected to vehicle controller 5. When the vehicle is started, peripheral checkup device 6 is turned on to determine the cause of a ground fault and its location. In this way, each time when the vehicle is started it is possible to determine the occurrence of a ground fault, the cause of the occurrence of a ground fault and the site of the occurrence of a ground fault. Consequently, it is possible to avoid the problem of not being able to identify that a capacitive ground fault has occurred as a result of the water that caused the ground fault via penetration between the high-voltage electrical system and the vehicle chassis having later evaporated.

Again, the above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A ground fault detector for determining a ground fault in a circuit connected to a power source, the ground fault detector comprising:
    a capacitor, one side of which is connected to an output of the power source;
    a pulse generator that applies a pulse signal to a measurement point on an opposite side of the capacitor, the pulse signal generated at a oscillation frequency;
    a voltage detecting part that detects the voltage amplitude generated at the measurement point when the pulse signal is applied to the measurement point; and
    a controller operable to detect an occurrence of a ground fault in the circuit based on a change in the voltage amplitude as compared to an original voltage amplitude of the pulse signal, to change the oscillation frequency of the pulse signal, and to determine a cause of the occurrence of the ground fault by comparing the voltage amplitude detected when the pulse signal is generated at the oscillation frequency to a voltage amplitude resulting from generation of the pulse signal at a changed oscillation frequency.

2. The ground fault detector according to claim 1 wherein the controller is further operable to estimate a change in an impedance of the circuit on the basis of a ground fault capacitance from a change between the voltage amplitude detected when the pulse signal is generated at the oscillation frequency and the voltage amplitude resulting from generation of the pulse signal at the changed oscillation frequency, the change in the impedance indicating the cause of the occurrence of the ground fault.

3. The ground fault detector according to claim 2 wherein the controller is further operable to determine that the cause of the ground fault is moisture content when the impedance based on the ground fault capacitance influences the voltage amplitude due to the change in the oscillation frequency of the pulse signal and to determine that the cause of the ground fault is a direct contact when the impedance based on the ground fault capacitance does not influence the voltage amplitude due to the change in the oscillation frequency of the pulse signal.

4. The ground fault detector according to claim 1 wherein the controller is further operable to determine that the cause of the ground fault is moisture content when the voltage amplitude detected when the pulse signal is generated at the oscillation frequency is greater than a prescribed judgment value and to determine that the cause of the ground fault is a direct contact when the voltage amplitude detected when the pulse signal is generated at the oscillation frequency is less than the prescribed judgment value.

5. The ground fault detector according to claim 1 wherein the controller is further operable to determine that the cause of the ground fault is moisture content when the voltage amplitude detected when the pulse signal is generated at the oscillation frequency is less than a prescribed judgment value and to determine that the cause of the ground fault is a direct contact when the voltage amplitude detected when the pulse signal is generated at the oscillation frequency is greater than the prescribed judgment value.

6. The ground fault detector according to claim 1 wherein the circuit comprises at least one electrical equipment unit connected to the power source to receive power from the power source for operation; and wherein a connection relationship of the capacitor is switched for each electrical equipment unit when the controller is detecting the occurrence of the ground fault.

7. A ground fault detector for evaluating ground faults in an electrical system of a vehicle, the electrical system including a power source, the detector comprising:
    an output terminal of the power source connected to one side of a coupling capacitor;
    pulse generating means for applying a pulse signal at a prescribed oscillation frequency to a measurement point on an opposite side of the capacitor;
    voltage detection means for detecting a voltage amplitude generated at the measurement point when the pulse signal is applied;
    ground fault detection means for detecting an occurrence of a ground fault of the circuit based on the voltage amplitude detected by the voltage detection means; and
    cause-of-ground-fault judgment means for changing an oscillation frequency of the pulse signal applied to the measurement point and for determining a cause of the ground fault based on a change in the voltage amplitude detected before and after change of the oscillation frequency.

8. The ground fault detector according to claim 7 wherein the cause-of-ground-fault judgment means further comprises means for determining a variation in an impedance based on a ground fault capacitance using the change in the voltage amplitude due to the change of the oscillation frequency wherein the variation indicates the cause of the ground fault.

9. The ground fault detector according to claim 8 wherein the cause-of-ground-fault judgment means performs the following operation: when the impedance based on the ground fault capacitance influences the voltage amplitude due to a change in the oscillation frequency of the pulse signal, it is determined that ground fault is due to the presence of water, and, conversely, when the impedance based on the ground fault capacitance does not influence the voltage amplitude due to a change in the oscillation frequency of the pulse signal, it is determined that ground fault is due to direct contact.

10. The ground fault detector according to claim 7 wherein the electrical system further comprises at least one electrical equipment unit coupled to the power source to receive power from the power source for operation; and, for each of the electrical equipment units, a connection relationship of the coupling capacitor is switched to detect the occurrence of the ground fault.

11. A ground fault detection method for an electric system for a vehicle, the electrical system comprising a power source and at least one unit coupled to the power source to receive power from the power source, the method comprising:
applying a pulse signal to a measurement point at one end of a coupling capacitor, the other end of the coupling capacitor coupled to the power source;
detecting a voltage amplitude generated at the measurement point;
detecting a presence or an absence of a ground fault of the system based on comparing the voltage amplitude to an amplitude of the pulse signal;
changing an oscillation frequency of the pulse signal when the presence of the ground fault is detected;
comparing a change in the voltage amplitude before and after the changing of the oscillation frequency, the change indicating a cause of the ground fault; and
outputting a signal corresponding to the cause of the ground fault.

12. The ground fault detection method according to claim 11 wherein comparing the change in the voltage amplitude further comprises estimating a change in impedance of the system due to a ground fault capacitance based on the change in the voltage amplitude.

13. The ground fault detection method according to claim 12, further comprising:
finding that the cause of the ground fault is moisture content when the change in impedance influences the voltage amplitude due to the changing oscillation frequency of the pulse signal; and
finding that the cause of the ground fault is direct contact when the change in impedance does not influence the voltage amplitude due to the changing oscillation frequency of the pulse signal.

14. The ground fault detection method according to claim 11, further comprising:
finding that the cause of the ground fault is moisture content when the voltage amplitude is greater than a prescribed judgment value when the oscillation frequency of the pulse signal is lowered; and
finding that the cause of the ground fault is direct contact when the voltage amplitude is less than the prescribed judgment value.

15. The ground fault detection method according to claim 11, further comprising:
finding that the cause of the ground fault is moisture content when the voltage amplitude is less than a prescribed judgment value when the oscillation frequency of the pulse signal is lowered; and
finding that the cause of the ground fault is direct contact when the voltage amplitude is greater than the prescribed judgment value.

16. The ground fault detection method according to claim 11 wherein detecting a presence or absence of a ground fault of the system based on comparing the voltage amplitude to the amplitude of the pulse signal further comprises detecting the presence of the ground fault when the voltage amplitude is less than the amplitude of the pulse signal.

17. The ground fault detection method according to claim 11 wherein changing an oscillation frequency of the pulse signal further includes lowering the oscillation frequency to a lower frequency, the method further comprising:
measuring a first voltage amplitude at the lower frequency; and wherein comparing a change in the voltage amplitude before and after the changing of the oscillation frequency further comprises comparing the first voltage amplitude to a low frequency judgment value;
finding that the cause of the ground fault is a resistive ground fault when the first voltage amplitude is smaller than the low frequency judgment value; and
finding that the cause of the ground fault is a capacitive ground fault when the first voltage amplitude is greater than the low frequency judgment value.

18. The ground fault detection method according to claim 17 wherein changing an oscillation frequency of the pulse signal further includes raising the oscillation frequency to a higher frequency, the method further comprising:
measuring a second voltage amplitude at the higher frequency; and wherein comparing a change in the voltage amplitude before and after the changing of the oscillation frequency further comprises comparing the second voltage amplitude to a high frequency judgment value;
finding that the cause of the ground fault is the resistive ground fault when the second voltage amplitude is greater than the high frequency judgment value; and
finding that the cause of the ground fault is the capacitive ground fault when the second voltage amplitude is smaller than the high frequency judgment value.

19. The ground fault detection method according to claim 11 wherein changing an oscillation frequency of the pulse signal further includes raising the oscillation frequency to a higher frequency, the method further comprising:
measuring a first voltage amplitude at the higher frequency; and wherein comparing a change in the voltage amplitude before and after the changing of the oscillation frequency further comprises comparing the first voltage amplitude to a high frequency judgment value;
finding that the cause of the ground fault is a resistive ground fault when the first voltage amplitude is greater than the high frequency judgment value; and
finding that the cause of the ground fault is a capacitive ground fault when the first voltage amplitude is smaller than the high frequency judgment value.

20. The ground fault detection method according to claim 11, further comprising:
switching a connection relationship between respective ones of the power source and the at least one unit to the coupling capacitor prior to applying the pulse signal; and wherein applying the pulse signal to the measurement point further includes applying the pulse signal for each connection relationship; and wherein detecting a presence or an absence of a ground fault of the system further includes detecting a location of the ground fault in at least one of the power source and the at least one unit.

* * * * *